United States Patent [19]

Wanlass

[11] Patent Number: 5,376,185
[45] Date of Patent: Dec. 27, 1994

[54] SINGLE-JUNCTION SOLAR CELLS WITH THE OPTIMUM BAND GAP FOR TERRESTRIAL CONCENTRATOR APPLICATIONS

[75] Inventor: Mark W. Wanlass, Golden, Colo.

[73] Assignee: Midwest Research Institute, Kansas City, Mo.

[21] Appl. No.: 61,635

[22] Filed: May 12, 1993

[51] Int. Cl.$^5$ .................. H01L 31/06; H01L 31/0304
[52] U.S. Cl. ............................. 136/262; 257/461; 257/615
[58] Field of Search ............. 136/262; 257/461, 615, 257/616

[56] References Cited

U.S. PATENT DOCUMENTS

| | | | |
|---|---|---|---|
| 3,993,506 | 11/1976 | Moon | 136/262 |
| 4,017,332 | 4/1977 | James | 136/246 |
| 4,388,383 | 6/1983 | Heller | 429/111 |
| 4,392,297 | 7/1983 | Little | 437/5 |
| 4,544,799 | 10/1985 | Barnett | 136/262 |
| 4,591,654 | 5/1986 | Yamaguchi et al. | 136/252 |
| 4,915,744 | 4/1990 | Ho et al. | 136/262 |
| 4,935,384 | 6/1990 | Wanlass | 437/107 |
| 4,997,491 | 3/1991 | Hokuyo et al. | 136/255 |
| 5,034,068 | 7/1991 | Glenn et al. | 136/256 |
| 5,121,183 | 6/1992 | Ogasawara et al. | 257/21 |

OTHER PUBLICATIONS

M. L. Ristow et al, *Conference Record, 21st IEEE Photovoltaic Specialists Conf.*, May 1990, pp. 115–118.
H. F. MacMillan et al, Conference Record, 20th IEEE *Photovoltaic Specialists Conf.*, Sep. 1988, pp. 462–468.
S. M. Vernon et al, *Conference Record, 19th IEEE Photovoltaic Specialists Conf.*, May 1987, pp. 108–112.
S. L. Rhoads et al, *Conference Record, 20th IEEE Photovoltaic Specialists Conf.*, Sep. 1988, pp. 649–653.
R. Yonezawa et al, *Solar Energy Materials*, vol. 23, Dec. 1991, pp. 363–370.
H. D. Law et al, *IEEE Electron Device Letters*, vol. EDL-2, Feb. 1981, pp. 26–27.
M. W. Wanlass, et al., "Advanced High-Efficiency Concentrator Tandem Solar Cells," Twenty Second IEEE Photovoltaic Specialists Conference, pp. 38–45, (1991).

*Primary Examiner*—Aaron Weisstuch
*Attorney, Agent, or Firm*—Ken Richardson; Edna M. O'Connor

[57] ABSTRACT

A single-junction solar cell having the ideal band gap for terrestrial concentrator applications. Computer modeling studies of single-junction solar cells have shown that the presence of absorption bands in the direct spectrum has the effect of "pinning" the optimum band gap for a wide range of operating conditions at a value of 1.14±0.02 eV. Efficiencies exceeding 30% may be possible at high concentration ratios for devices with the ideal band gap.

15 Claims, 6 Drawing Sheets

SINGLE-JUNCTION SOLAR CELLS WITH THE OPTIMUM BAND GAP FOR TERRESTRIAL CONCENTRATOR APPLICATIONS

CONTRACTUAL ORIGIN OF THE INVENTION

The United States Government has rights in this invention under Contract No. DE-AC0283CH10093 between the U.S. Department of Energy and the National Renewable Energy Laboratory, a division of Midwest Research Institute.

BACKGROUND OF THE INVENTION

1. Field of the Invention

The present invention relates to solar cells designed for operation under concentrated sunlight, and more particularly to concentrator cells having optimum band gaps.

2. Description of the Prior Art

It is known that in order to generate electricity economically using sunlight and solar cells, one needs the following:

(1) low-cost solar collectors, and
(2) high-efficiency energy converters.

The photovoltaic cell, commonly known as the solar cell, is an attempt to satisfy these two requirements with the same element. Alternatively, a low-cost lens can be utilized to concentrate the sunlight onto a small-area high-efficiency solar cell. The lens thus acts as the low-cost solar collector, in combination with a more expensive high-efficiency energy converter. Solar cells designed to operate with concentrated sunlight are a special class of solar cells distinctly different in many respects from the more conventional fiat-plate solar cells.

A concentrator solar cell is a solar cell operated at the focus of a lens or reflector system. As with any solar cell, high performance requires good junction quality and high minority-carrier diffusion lengths. However, a concentrator cell operates at higher light-generated current density than does a flat-plate cell. This higher current density operation allows for higher energy conversion efficiencies, provided the grid series resistance can be kept small. High-quality material is required in order to obtain these results. The semiconductor material used must have an acceptably low mid-gap recombination state density. If the solar cell is ideal, its performance is predictable from the semiconductor intrinsic energy gap. For materials with direct band gaps, all the incident light with photon energy above the band gap is absorbed, creating minority-carriers that diffuse to the junction where they are collected. This light-generated current is opposed by a much smaller dark current consisting of majority-carriers diffusing over the junction barrier. This junction barrier is again related primarily to the semiconductor intrinsic energy gap.

Doubling the light intensity incident on a solar cell in turn doubles the device short-circuit current. This in itself does not change the device energy-conversion efficiency. However, when the current in a diode is increased, the diode voltage increases. Since the solar cell voltage increases with increasing light levels, the result is that the solar cell energy-conversion efficiency increases when operated with concentrated light.

To date, the highest terrestrial efficiencies for single-junction solar cells, approximately 28%, have been realized with GaAs homojunction devices at concentration ratios of approximately 200 suns. Close behind are Si concentrator cells which have reached efficiencies of approximately 27% at similar concentration ratios.

Solar cells operating tinder concentrated sunlight in areas of high direct insolation have been identified as one of the more cost effective applications of photovoltaics. Previous efforts in the field have focused on the use of Si and GaAs cells in these systems. However, efficiency gains on the cell level have a dramatic impact on the system cost analysis. Consequently, a determination of the true optimum band gaps has not been pursued for these materials, but rather, more efficient alternatives to GaAs and Si, such as multi-junction concentrator devices, are being investigated. A disadvantage of multi-junction devices is that the fabrication of monolithic multi-junction cells is quite complex and thus potentially costly.

Consequently, there remains a need for a single-junction terrestrial device designed for operation under concentrated sunlight having higher energy-conversion efficiencies and reduced usage of costly photovoltaic (PV) materials.

SUMMARY OF THE INVENTION

Accordingly, it is a general object of the present invention to provide a method and apparatus for achieving high solar energy conversion efficiency on Earth.

It is a more specific object of this invention to provide a single-junction concentrator cell having an optimum band gap for terrestrial applications.

Additional objects, advantages, and novel features of this invention shall be set forth in part in the description that follows, and in part will become apparent to those skilled in the art upon examination of the following specification or may be learned by the practice of the invention. The objects and advantages of the invention may be realized and attained by means of the instrumentalities, combinations, and methods particularly pointed out in the appended claims.

To achieve the foregoing and other objects and in accordance with the purposes of the present invention, as embodied and broadly described therein, the apparatus of this invention may comprise a quaternary alloy composition having a fixed band gap of $1.14\pm0.02$ eV.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the Drawings.

DETAILED DESCRIPTION OF THE PREFERRED EMBODIMENTS

Figure 1:
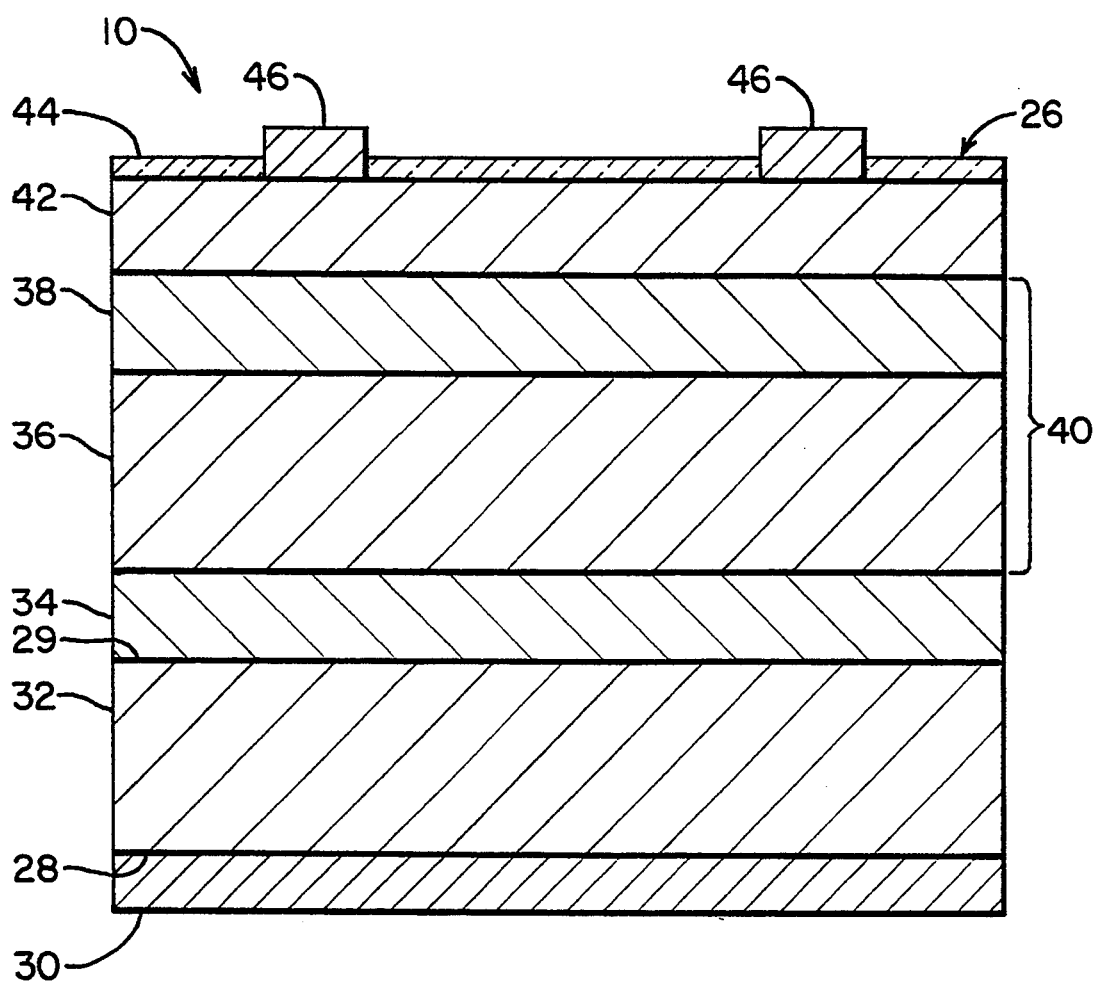
FIG. 1 is a cross-sectional view of the $1.14\pm0.02$ eV GaInAsP concentrator solar cell of the present invention.
Figure 2:
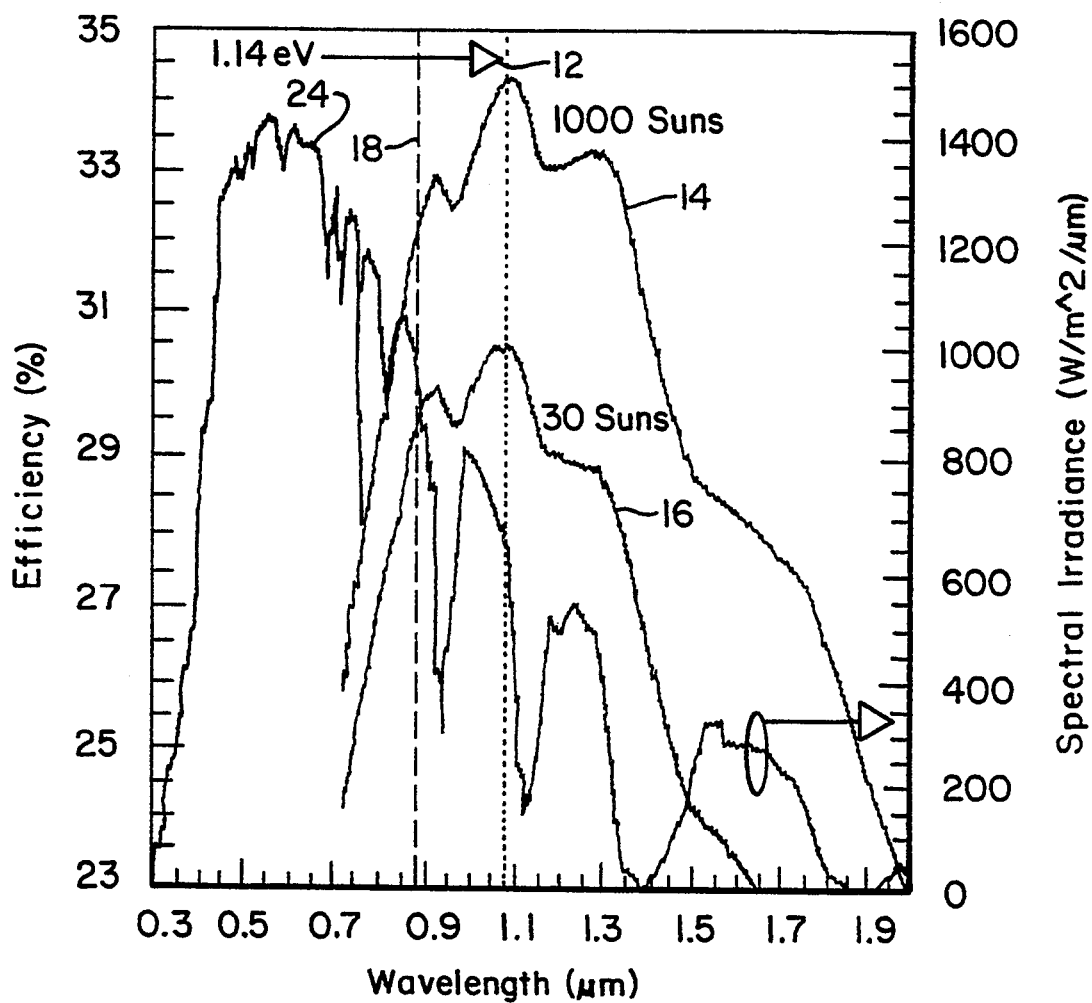
FIG. 2 is a plot of the spectral irradiance for the direct spectrum (ASTM E891) superimposed over a graph of the modeled solar cell efficiency data as a function of energy gap (band gap) and concentration ratio (C) for concentrations of 30 suns and 1000 suns at 25° C.
Figure 3:
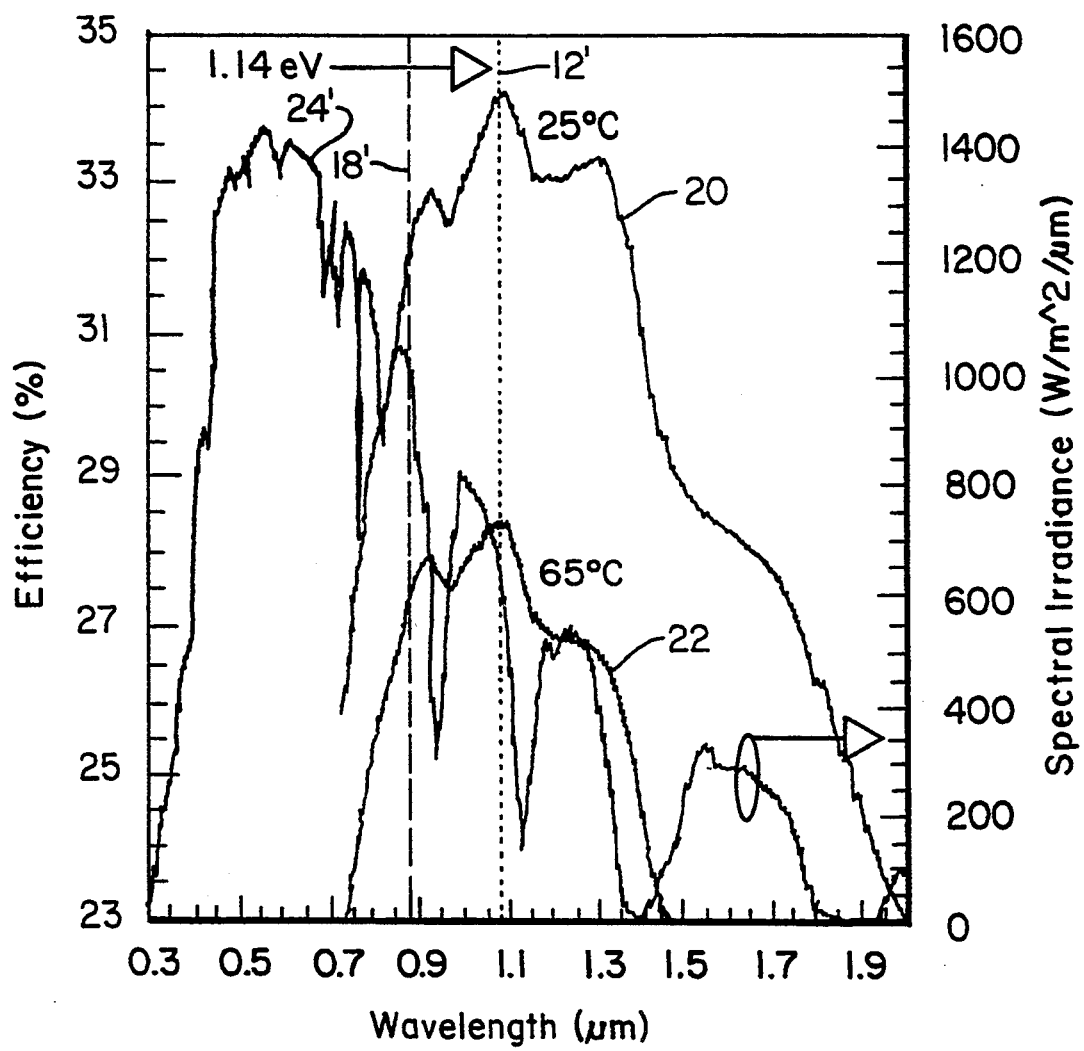
FIG. 3 is a plot of the spectral irradiance for the direct spectrum (ASTM E891) superimposed over a graph of the modeled solar cell efficiency data as a function of energy gap (band gap) and temperature for temperatures at 25° C. and 65° C. at a fixed concentration of 1000 suns.

The single-junction solar cell having an optimum band gap 10 for terrestrial concentrator applications according to the present invention, is best seen in FIG. 1. The single-junction solar cell having an optimum band gap 10 is comprised of a photovoltaic (PV) device or assembly 26 having a fixed band gap value of approximately 1.14 eV or 1.14±0.02 eV. Referring now primarily to FIGS. 2 and 3, as a basis for the single-junction solar cell having an optimum band gap 10 according to the present invention, computer modeling studies have been performed to determine the optimum band gap for a single-junction solar cell under typical terrestrial concentrator operating conditions. The model assumes a direct band gap and unity external quantum efficiency; however, the parameters used to calculate the voltage and fill factor are derived from an empirical formulation that is based on data from existing state-of-the-art solar cells. The computer (not shown) is equipped with a math coprocessor and a software package, as will be readily understood by persons skilled in the art of computerized calculation of solar cell performance. An example of this computerized calculation is further described in a technical paper entitled "Advanced High-Efficiency Concentrator Tandem Solar Cells" by Wanlass et al., Twenty-Second IEEE Photovoltaic Specialists Conference, 1, 38–45, (1991). This program essentially allows for the calculation of cell efficiency through the use of the following equation:

$$\eta = P_{out}/P_{in} = V_{oc}J_{sc}FF/P_{in}$$

wherein $P_{out}$ is the electrical power output of the cell, $P_{in}$ is the solar optical power incident on the cell, $V_{oc}$ represents the open-circuit voltage, $J_{sc}$ represents the short-circuit current density, and FF represents the fill factor. For these calculations, the direct spectrum (ASTM E891) and concentration ratio values of 30 and 1000 were used and junction temperatures ranging from 25° C. to 80° C. were investigated. The solar cell efficiency was determined as a function of the band gap of the cell for each set of conditions.

Currently, GaAs concentrator cells lead the way in terms of efficiency and therefore the same was used as a baseline for comparison with the modeled efficiency for a cell with the optimum band gap. In modeling calculations, the band gap of GaAs was taken to be 1.43 eV at 25° C. and 1.41 eV at 80° C. The modeled solar cell efficiency curves 14 and 16 representing concentration ratios (C) of 1000 suns and 30 suns, respectively, are plotted in FIG. 2 as a function of the energy gap (band gap) and concentration ratio (C) for an operating temperature of 25° C. From these data, it is evident that the optimum band gap 12 holds a significant efficiency advantage over the GaAs band gap 18 over a wide temperature range.

The data presented below in table 1 contains a summary of computer modeling results for single-junction concentrator solar cells operated under the direct spectrum (ASTM E891) as a function of the concentration ratio, and at two temperatures. These data show that, for high concentration ratios, the optimum band gap is essentially independent of the concentration ratio and operating temperature and has a value of approximately 1.14 eV. Second, these data illustrate that the optimum band gap holds a significant efficiency advantage over GaAs at high concentration ratios and at both temperatures. On the average, the modeled efficiencies for the optimum band gap are about 2 percentage points higher than the modeled values for GaAs devices.

| Concentration Ratio | Optimum Band Gap (eV) | Efficiency for the Optimum Band Gap | Efficiency for GaAs (%) |
| --- | --- | --- | --- |
| T = 25° C. | | | |
| 10 | 1.15 | 29.5 | 28.5 |
| 100 | 1.15 | 32.0 | 30.2 |
| 1000 | 1.14 | 34.5 | 32.0 |
| T = 80° C. | | | |
| 10 | 1.34 | 26.0 | 25.7 |
| 100 | 1.15 | 28.4 | 27.8 |
| 1000 | 1.14 | 31.3 | 30.0 |

FIGS. 2 and 3 graphically illustrate that the "pinning" of the optimum band gap 12 and 12', respectively, at approximately 1.14 eV holds a significant efficiency advantage over the GaAs band gap 18 and 18', respectively, at high concentration ratios and over wide temperature ranges. The structure in the efficiency curves 14, 16, 20, and 22 can also be traced to the existence of absorption bands in the direct solar spectrum 24 and 24' of FIGS. 2 and 3, respectively.

There are two primary effects that are responsible for these results. The first is the effect of operation under concentration on the open circuit voltage of the device. Operation under concentration affords roughly a 58 mV increase in $V_{oc}$ per decade of concentration. This effect is independent of the band gap. Therefore, the fractional increase in the voltage as a function of the concentration ratio is greater for a lower gap material. Additionally, lower band gaps are able to utilize a greater portion of the indirect spectrum. This is why a 1.14 eV device will out-perform GaAs, which has a band gap of 1.43 eV.

The second effect that leads to the "pinning" of the optimum band gap of 1.14 eV is the prominent water vapor absorption band in the direct spectrum centered at 1150 nm. Because of this absorption band, when the band gap is lowered from 1.14 eV, there is a drop in the voltage that is unaccompanied by a corresponding rise in the current. This spectral effect is responsible for the fact that the optimum band gap is not a function of the operating temperature or the concentration ratio.

The fact that the optimum direct band gap for terrestrial concentrator applications is independent of the operating conditions is significant because it implies that the wide range of concentration systems currently under investigation could benefit from the use of the same cell material. Described in further detail below are some examples of the various possible material systems in which a band gap of 1.14 eV is achievable.

Referring now primarily to FIG. 1, the single-junction solar cell having an optimum band gap 10 according to the present invention, includes the deposition of a multilayer solar cell structure 26 by way of atmospheric-pressure metalorganic vapor-phase epitaxy (AP-MOVPE) or the like. The quaternary alloy $Ga_xIn_{1-x}As_yP_{1-y}$ can be epitaxially grown lattice matched to InP over a wide range of compositions and band gaps (0.75-1.35 eV). A band gap of approximately 1.14 eV at room temperature is achieved with $x=0.11$ and $y=0.25$. The first layer deposited upon the surface 29 of the p+-InP substrate 32 is an InP buffer layer 34 having a thickness of about 0.5 microns. The InP buffer layer 34 also serves as a back-surface minority-carrier confinement layer for the approximately 1.14 eV GaInAsP base layer 36. Active regions of lattice-matched 1.14±0.02 eV GaInAsP may then be grown to form the base and emitter layers 36 and 38, respectively, of the cell junction. Base and emitter layers 36 and 38, respectively, are grown to a thickness of about 3.5 μm and 45 nm, respectively. Either p+/n or n+/p doping schemes may be used for the emitter/base structure 40. A window layer 42 having a thickness of about 33 nm is then deposited upon the emitter/base structure 40. The window layer 42 may be made of InP; however, it may not be the most desirable choice for maximum efficiency due to its relatively low band gap (1.35 eV at room temperature). In order to achieve higher transparency in the window, pseudomorphic window layers of sub-critical thickness (i.e., elastically strained) and made of GaInP or AlInAs may be used. An antireflection coating 44 having a thickness on the order of 150 nm is finally deposited upon window layer 42, followed by top grid contacts 46 that have been engineered to accommodate Entech prismatic covers (not shown) as a means of achieving high performance under concentration. Top grid contacts that are optimally designed for increasing concentration ratios that do not require Entech covers may also be used. The antireflection coating comprises a dual-layer of ZnS followed by $MgF_2$ having a thickness of about 55 nm and 95 nm, respectively. Other optimized antireflection coating systems may also be used. Finally, a back contact 30 is affixed to the surface 28 of the P+-In substrate 32. The back contact 30 may be made of a gold-zinc alloy, for example.

Figure 4:
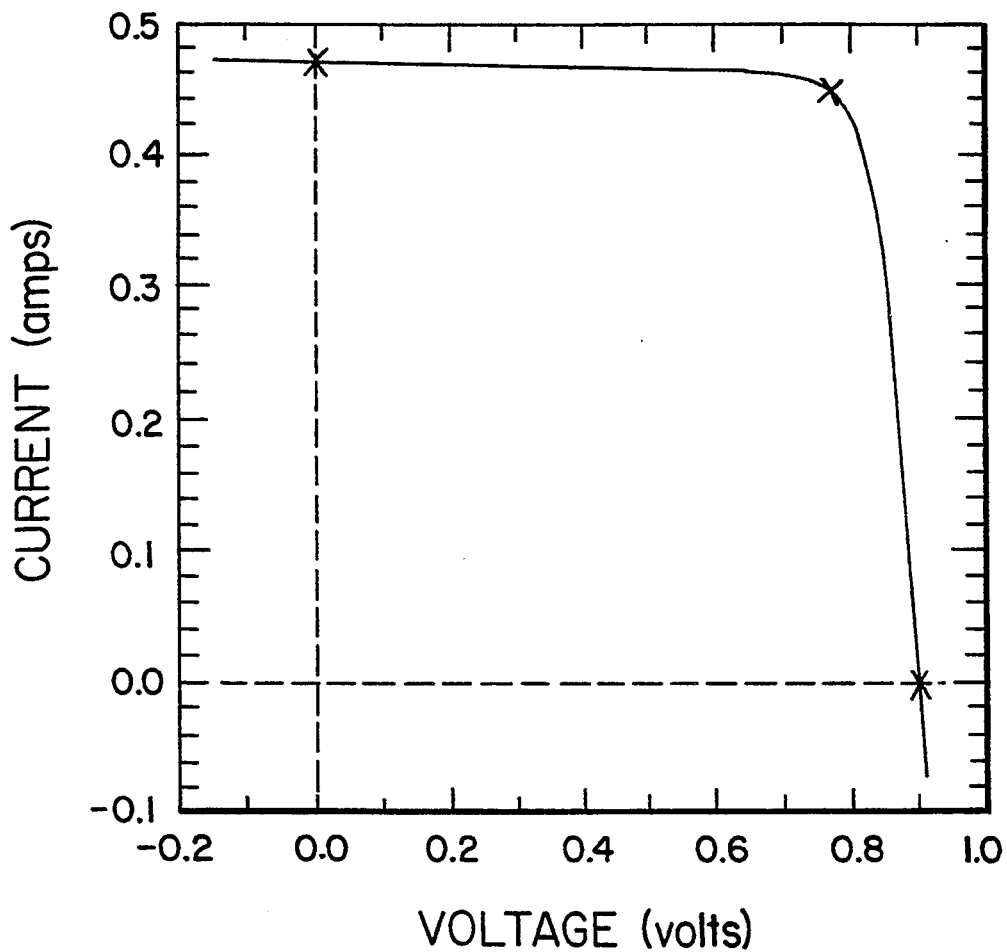
FIG. 4 is a graph of the current-voltage characteristics of the GaInAsP concentrator cell of the present invention at peak performance.
Figure 5:
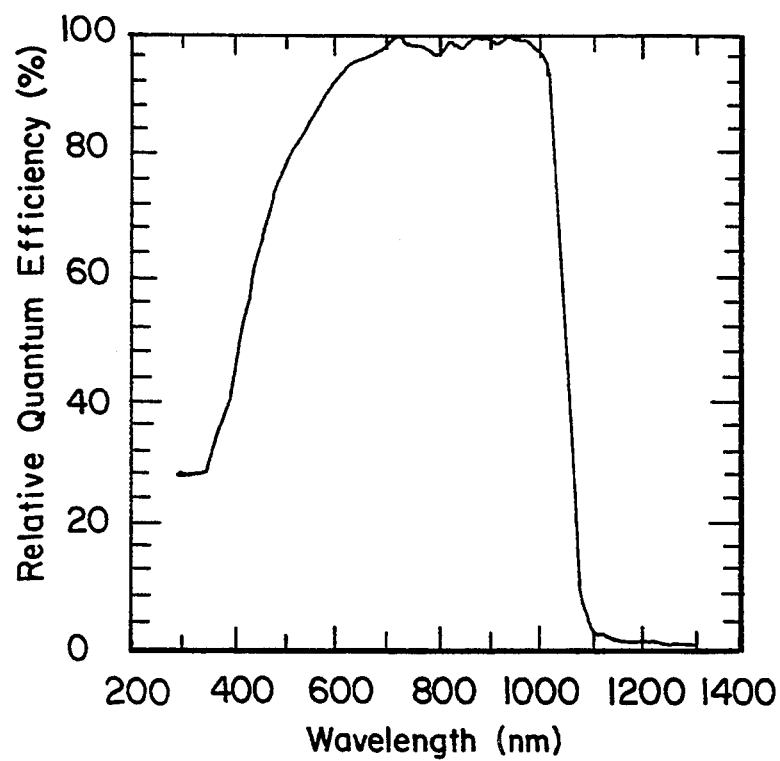
FIG. 5 is a graph of the quantum efficiency data for the concentrator solar cell of the present invention, which displays a substantial drop in the blue response.

Efficiency data for the best 1.14 eV ±0.02 eV GaInAsP cell 26 fabricated to date are shown in FIG. 4. An efficiency of 27.5% at a concentration ratio of 171 under the direct spectrum at 25° C. has been achieved. As shown in FIG. 5, the quantum efficiency data for the approximately 1.14 eV GaInAsP cells show a substantial drop in blue response, which suggests that significant improvements in the cell efficiency are still possible.

Figure 6:
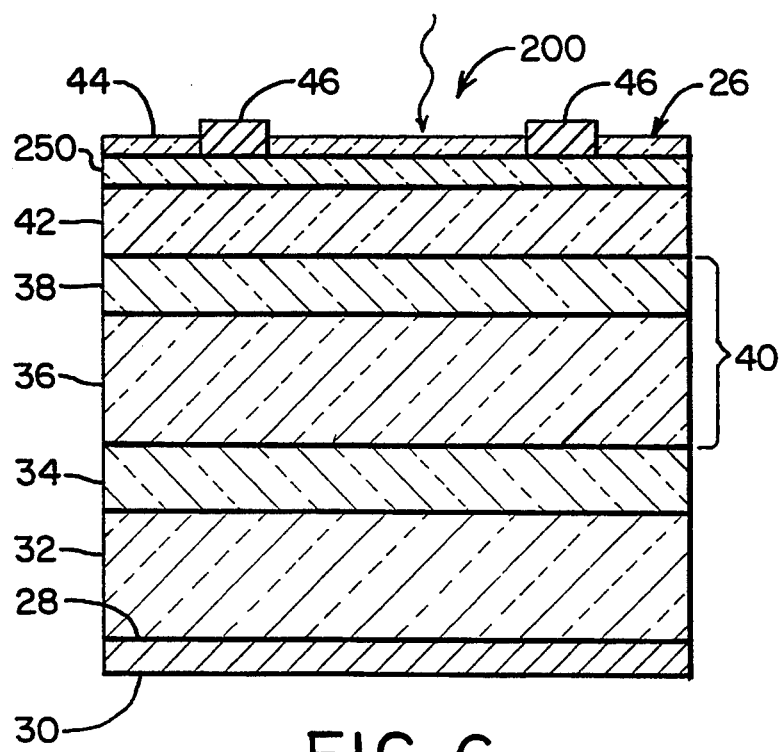
FIG. 6 is a cross-sectional view of a first embodiment of a GaInAsP concentrator solar cell having a contacting layer interposed between the antireflective coating and the window layer.

FIG. 6 shows an alternate embodiment 200 having an electrically conductive material or contacting layer 250 interposed between the antireflective coating 44 and the window layer 42. Contacting layer 250 could be added to the surface of the window layer 42 to facilitate the formation of a low-resistance grid contact. The contacting layer 250 may be made of InP or GaInAs (depending upon the doping type), which could be removed between the grid lines during the cell processing procedure.

Figure 7:
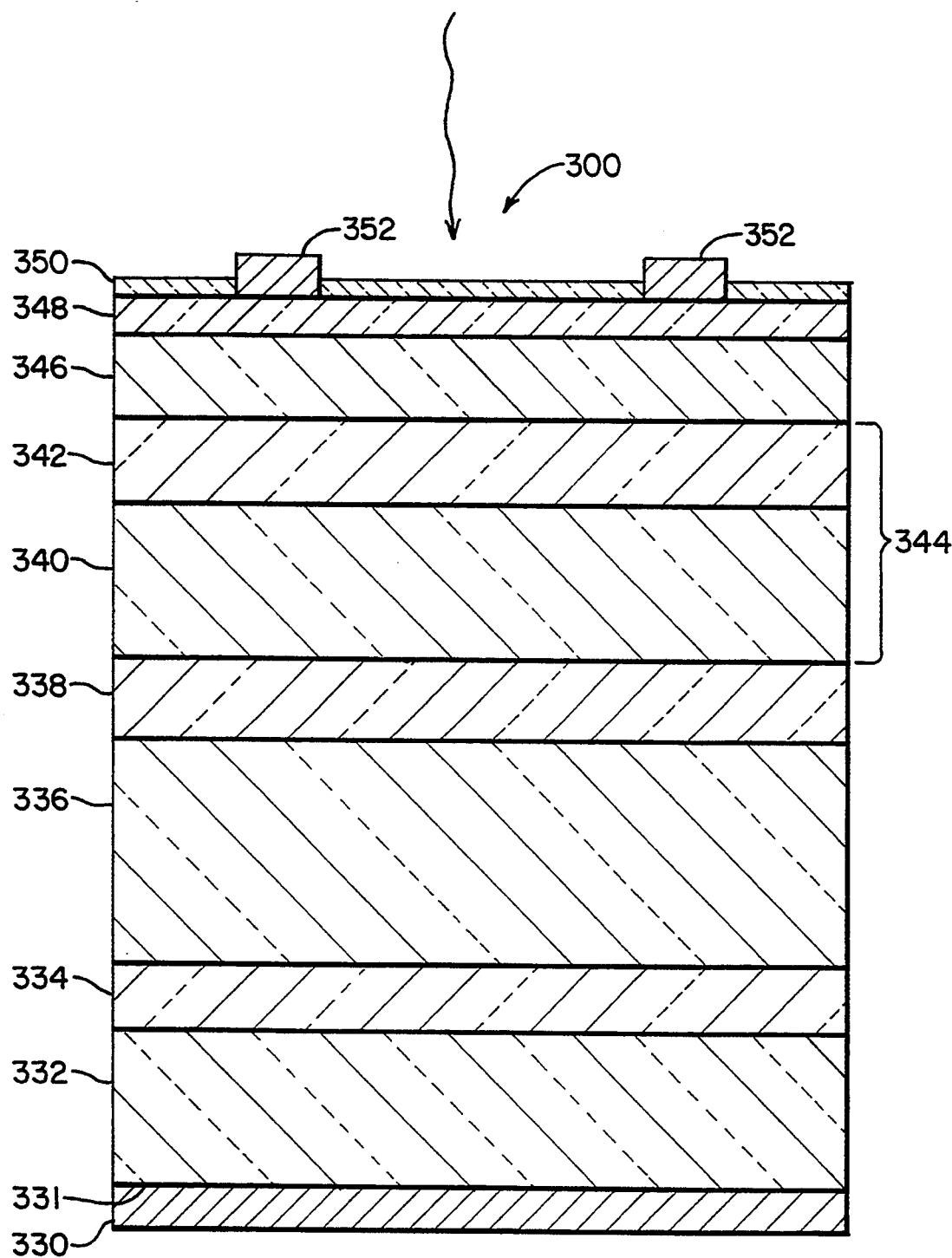
FIG. 7 is a cross-sectional view of a proposed second embodiment of the present invention of a 1.14±0.02 eV GaInAs concentrator solar cell.

A proposed second embodiment 300 of the present invention is shown in FIG. 7, having a ternary alloy $Ga_{1-x}In_xAs$ that has a direct band gap that decreases monotonically with increasing In content added to the binary semiconductor GaAs. Alternatively, a single crystal Ge substrate could be substituted for a single crystal GaAs substrate. Ge is advantageous in that it is lighter, less expensive, and stronger than GaAs. A band gap of approximately 1.14 eV is obtained at room temperature for $x=0.22$. If grown on a GaAs or Ge substrate, such an alloy would have a lattice mismatch of about 1.6% with the substrate. The cell design includes as many as 7 epitaxial layers and is based on a GaAs or Ge substrate 332.

A GaAs buffer layer 334 is used to initiate the structure, followed by a GaInAs compositionally-graded layer 336, where the In content is increased as the layer thickness increases. Several options are possible for the In profile in, and the thickness of, the graded layer 336; however, a typical scheme might consist of a layer that is about 10 μm thick and that has an In profile that varies linearly. In any case, the In content at the top of the graded layer must reach the desired value of about $x=0.22$. The graded layer 336 is a very important feature in the structure since it serves to reduce the density of crystalline defects in the active solar cell layers as a result of the lattice mismatch between the cell layers 334-348 and the GaAs substrate 332. Following graded layer 336, a back surface confinement layer 338 is grown which may consist of lattice-matched layers of GaInP or AlInAs (i.e., lattice matched to $Ga_{0.78}In_{0.22}As$). Next, the 1.14±0.02 eV GaInAs junction layers 344, comprised of the 1.14±0.02 eV GaInAs base layer 340 and 1.14±0.02 eV GaInAs emitter layer 342, are grown and these could have either a p+/n or an n+/p doping configuration. The window layer 346, comprising lattice-matched layers of GaInP, AlInAs, or a pseudomorphic version of these materials as discussed previously is then deposited. Finally, an optional contacting layer 348 may be deposited upon the window layer 346, if desired. Contacting layer 348 may be made of a material such as GaInAs. Electrical contacts 330 are affixed to the back surface 331 of the substrate 332, and grid contacts 352 are affixed to the window layer 346. The proposed structure 300 is completed by applying a suitable antireflection coating 350 and possibly, an Entech prismatic cover. Alternatively, the GaInAs solar cell structure described above may be deposited directly (i.e., without a graded layer) upon bulk ternary materials such as a GaInAs substrate in the event bulk materials become readily available.

A third embodiment (not shown) may comprise a ternary alloy InAsP grown on an InP substrate having a graded layer of InAsP disposed between the substrate and the active layers comprising the solar cell junction.

The foregoing description is considered as illustrative only of the principles of the invention. Furthermore, since numerous modifications and changes will readily occur to those skilled in the art, it is not desired to limit the invention to the exact construction and process as described above. Accordingly, all suitable modifications and equivalents may be resorted to falling within the scope of the invention as defined by the claims which follow.

The embodiments of the invention in which an exclusive property or privilege is claimed are defined as follows:

1. A high-efficiency terrestrial concentrator solar cell comprising:
    an InP substrate having a front surface and a back surface;

a back-metal contact affixed to said back surface of said substrate;

an InP buffer layer having a similar conductivity as that of said InP substrate, said buffer layer being deposited on said front surface of said substrate;

a quaternary III-V semiconductor alloy base layer of a first conductivity type grown on said InP buffer layer, wherein said quaternary III-V semiconductor alloy base layer has a band gap equal to about 1.14 eV;

an emitter means grown on said base layer, wherein said emitter means comprises a layer of quaternary III-V semiconductor material of a second conductivity type having a band gap equal to about 1.14 eV;

a window layer deposited on said emitter layer, wherein said window layer comprises an InP material;

metal grid lines extending over and being electrically coupled to said window layer; and an antireflection coating deposited over said window layer.

2. The high-efficiency terrestrial concentrator device of claim 1, wherein said quaternary III-V semiconductor alloy base layer comprises a $Ga_xIn_{1-x}As_yP_{1-y}$ material of said conductivity type, wherein x is about 0.11 and y is about 0.25.

3. The high-efficiency terrestrial concentrator device of claim 1, wherein said quaternary III-V semiconductor material of said emitter layer comprises a $Ga_xIn_{1-x}As_yP_{1-y}$ material of said second conductivity type, wherein x is about 0.11 and y is about 0.25.

4. A high-efficiency terrestrial concentrator solar cell comprising:

a substrate having a front surface and a back surface;

a back-metal contact affixed to said back surface of said substrate;

a compositionally graded semiconductor layer grown on said front surface of said substrate to reduce the density of crystalline defects with the front surface of said substrate;

a semiconductor back surface confinement layer deposited on said compositionally graded layer;

a base layer of one conductivity type grown on said back surface confinement layer wherein said base layer has a band gap equal to about 1.14 eV;

an emitter layer grown on said base layer, wherein said emitter layer comprises a layer of semiconductor material of a second conductivity type having a band gap equal to about 1.14 eV;

a window layer deposited on said emitter layer, wherein said window layer comprises lattice matched semiconductor material;

metal grid lines extending over and being electrically coupled to said window layer; and an antireflection coating deposited over said window layer.

5. The high-efficiency terrestrial concentrator device of claim 4, wherein said substrate comprises a gallium-arsenide material.

6. The high-efficiency terrestrial concentrator device of claim 5, wherein said compositionally graded semiconductor layer, said base layer and said emitter layer are comprised of a gallium-indium-arsenide material.

7. The high-efficiency terrestrial concentrator device of claim 6, wherein said window layer and said semiconductor back surface confinement layer comprise gallium-indium-phosphide material.

8. The high-efficiency terrestrial concentrator device of claim 6, wherein said window layer and said semiconductor back surface confinement layer comprise aluminum-indium-arsenide material.

9. The high-efficiency terrestrial concentrator device of claim 6, wherein said window layer comprises a higher band gap pseudomorphic material.

10. The high-efficiency terrestrial concentrator device of claim 9, wherein said pseudomorphic material comprises an aluminum-indium-arsenide material.

11. The high-efficiency terrestrial concentrator of claim 9, wherein said pseudomorphic material comprises a gallium-indium-phosphide material.

12. The high-efficiency terrestrial concentrator device of claim 5, wherein said compositionally graded semiconductor layer, said base layer, said window layer and said emitter layer comprises an InAsP material.

13. The high-efficiency terrestrial concentrator device of claim 4, wherein said substrate comprises a germanium material.

14. The high-efficiency terrestrial concentrator device of claim 4, wherein said substrate comprises an InP material.

15. A high-efficiency terrestrial concentrator solar cell comprising:

a substrate having a front surface and a back surface;

a back-metal contact affixed to said back surface of said substrate;

a buffer layer having a similar conductivity as that of said substrate, wherein said buffer layer is deposited on said front surface of said substrate;

a back surface minority carrier confinement layer deposited on said buffer layer;

a semiconductor base layer of a first conductivity type grown on said back surface minority carrier confinement layer, wherein said semiconductor base layer has a band gap equal to about 1.14 eV;

an emitter layer deposited on said base layer;

a window layer deposited on said emitter layer;

metal grid lines extending over and being electrically coupled to said window layer; and an antireflection coating deposited over said window layer.

* * * * *

UNITED STATES PATENT AND TRADEMARK OFFICE
CERTIFICATE OF CORRECTION

PATENT NO. : 5,376,185
DATED : December 27, 1994
INVENTOR(S) : Mark W. Wanlass

It is certified that error appears in the above-indentified patent and that said Letters Patent is hereby corrected as shown below:

In column 2, line 3, change "tinder" to --under--.

Signed and Sealed this

Second Day of May, 1995

Attest:

BRUCE LEHMAN

*Attesting Officer*    *Commissioner of Patents and Trademarks*